US010107838B2

(12) United States Patent
Li et al.

(10) Patent No.: US 10,107,838 B2
(45) Date of Patent: Oct. 23, 2018

(54) ONLINE MONITORING CIRCUIT AND METHOD OF THE SERIES COMPENSATION SPARK GAP DIVIDER RETURN CIRCUIT

(71) Applicants: STATE GRID CORPORATION OF CHINA, Beijing (CN); CHINA ELECTRIC POWER RESEARCH INSTITUTE, Beijing (CN)

(72) Inventors: Guofu Li, Beijing (CN); Hui Yu, Beijing (CN); Zhiyuan Li, Beijing (CN); Yongliang Li, Beijing (CN)

(73) Assignees: STATE GRID COOPERATION OF CHINA, Beijing (CN); CHINA ELECTRIC POWER RESEARCH INSTITUTE, Beijing (CN)

( * ) Notice: Subject to any disclaimer, the term of this patent is extended or adjusted under 35 U.S.C. 154(b) by 995 days.

(21) Appl. No.: 14/399,904

(22) PCT Filed: May 2, 2013

(86) PCT No.: PCT/CN2013/075094
§ 371 (c)(1),
(2) Date: Nov. 7, 2014

(87) PCT Pub. No.: WO2013/166931
PCT Pub. Date: Nov. 14, 2013

(65) Prior Publication Data
US 2015/0149102 A1    May 28, 2015

(30) Foreign Application Priority Data
May 7, 2012 (CN) .......................... 2012 1 0138918

(51) Int. Cl.
*G01R 19/00* (2006.01)
*H01T 15/00* (2006.01)
(Continued)

(52) U.S. Cl.
CPC .......... *G01R 19/0084* (2013.01); *G01R 1/30* (2013.01); *G01R 31/1227* (2013.01);
(Continued)

(58) Field of Classification Search
CPC ............. H01T 1/20; H01H 3/14; H01H 3/205
See application file for complete search history.

(56) References Cited

U.S. PATENT DOCUMENTS 4,890,180 A * 12/1989 Paulsson .................. H02H 7/16
361/130
6,584,965 B1 * 7/2003 Ward ........................ F02P 3/02
123/605

(Continued)

FOREIGN PATENT DOCUMENTS

| CN | 2850075 Y | 12/2006 |
| CN | 102662115 A | 9/2012 |
| CN | 202649366 U | 1/2013 |

OTHER PUBLICATIONS

Cai, Hansheng et al., Analysis on the Cause of Spark Gap System Self-Triggering of Hechi Series Compensation Device, Southern Power System Technology, Oct. 2009, vol. 3, No. 5, pp. 77-80, ISSN: 1674-0629 (English translation will be provided).

(Continued)

*Primary Examiner* — Michael Dalbo
(74) *Attorney, Agent, or Firm* — Platinum Intellectual Property LLP

(57) ABSTRACT

The present invention provides an online monitoring circuit of the series compensation spark gap divider return circuit. Said series compensation spark gap divider return circuit includes a voltage equalization link and a voltage sampling link. Said voltage link includes the capacitor C which series said voltage equalization link. Said online monitoring circuit includes the voltage sampling input module, series compensation current input module and the compare module. Said (Continued)

sampling voltage input module after amplified the voltage of the two ends of the series capacitor C converts it into direct current signal.

11 Claims, 5 Drawing Sheets

(51) Int. Cl.
    *H01H 3/20*     (2006.01)
    *F02P 17/12*     (2006.01)
    *G01R 1/30*     (2006.01)
    *G01R 31/12*     (2006.01)
    *H02H 3/20*     (2006.01)

(52) U.S. Cl.
    CPC ......... *F02P 2017/121* (2013.01); *H01T 15/00* (2013.01); *H02H 3/205* (2013.01)

(56) References Cited

U.S. PATENT DOCUMENTS

| | | | |
|---|---|---|---|
| 7,868,483 B2* | 1/2011 | Lu | H02J 7/0031 307/64 |
| 8,274,418 B2* | 9/2012 | Koli | G11C 27/024 341/155 |
| 2010/0008012 A1* | 1/2010 | Ben-Yaakov | F41B 15/04 361/232 |

OTHER PUBLICATIONS

"International Search Report and Written Opinion dated Aug. 1, 2013," International Application No. PCT/CN2013/075094, 9 pages.

* cited by examiner

ONLINE MONITORING CIRCUIT AND METHOD OF THE SERIES COMPENSATION SPARK GAP DIVIDER RETURN CIRCUIT

RELATED APPLICATIONS

This application is a United States National Stage Application filed under 35 U.S.C 371 of PCT Patent Application Serial No. PCT/CN2013/075094, filed May 2, 2013, which claims Chinese Patent Application Serial No. 2012/10138918.3, filed May 7, 2012, the disclosure of all of which are hereby incorporated by reference in their entirety.

FIELD OF THE INVENTION

The invention relates to the electronic or electrical technologies field, more particularly, relates to an online monitoring circuit and method of the series compensation spark gap divider return circuit.

BACKGROUND OF THE INVENTION

Installation of the series capacitor compensation (short for: SC) device on an existing circuit can shorten the electrical distance efficiently, while the occupation of the land resources is minimal, it is also the efficient technical means of enhancing the transmission capacity of the transmission line.

Series capacitor compensation device is composed of a series capacitor, a metal oxide voltage limiter MOV, a spark gap and other major equipment. The spark gap is the main protection of the MOV and the backup protection of the series capacitor, therefore it has a great demand on the working reliability, wherein the spark gap divider is a very important ancillary equipment of the spark gap, the working state of the spark gap divider relates directly to whether the spark gap can regular trigger when the line has a failure, which is one of the keys to guarantee the spark gap can work safely and reliably.

When the line installed in the series compensation device or the adjacent line goes wrong, the line current flows cross the series capacitor, resulting in the higher voltage being generated on both ends of the series capacitor. In order to prevent the capacitor being damaged by the high voltage, it needs to trigger the spark gap, quickly bypass series compensation in the series capacitor. Accordingly, the series compensation control protect device will issue the trigger order to the spark gap trigger control circuit, and the spark gap control circuit, after receiving the order of the series compensation control protect system, determines weather the systems has reached the preset threshold voltage. When it reaches the threshold voltage, the spark gap trigger control circuit will generate the ignition pulse. The spark gap control circuit gains the real time voltage form divider return circuit. Once the spark gap divider breaks down, it will cause the spark gap trigger control device not be able to get the accurate voltage value, which causes malfunction.

SUMMARY OF THE INVENTION

The present invention provides an online monitoring circuit and a method of using a spark gap divider return circuit, which enables the operator to master the divider return circuit working situation, avoid unnecessary trepidation, make sure the spark gap for trigger ignition when the line break down, and substantially improve the reliability of the spark gap. The present invention provides an online monitoring circuit of spark gap divider return circuit, the series capacitor, the spark gap and the series compensation spark gap divider return circuit parallel to each other The series compensation spark gap divider return circuit includes the voltage equalization link and the voltage sampling link; said voltage sampling link includes the capacitor C which is in series with said voltage equalization link; said online monitoring circuit includes the sampling voltage input module, the series current input module and the compare module; the voltage of the two ends of the capacitor C is amplified by said sampling voltage input module and converted into direct current signal $U_{divide\ voltage}$; the voltage signal of said series capacitor is amplified by said series compensation current input module and converted into direct current signal $U_{CT}$; said compare module makes online monitor for the working state of said series compensation spark gap divider return circuit through the way comparing said $U_{divide\ voltage}$ and said $U_{CT}$.

In the first preferred embodiment of the present invention provided, said series compensation current input module of the online monitoring circuit obtains the series capacitor current signal through a series measurement CT in the current transformer secondary circuit.

In the second preferred embodiment of the present invention provided, said voltage equalization link includes series capacitor C1,C2,C3 and C4; said sampling voltage input module includes the two state amplifying circuit U1B,U2B and the effective value conversion chip A;

Said U1B and U2B amplify and adjust the two-end voltage of said capacitor C, said effective value conversion chip A converses the signal after amplifying and adjusting into $U_{divide\ voltage}$ In the third preferred embodiment of the present invention provided, said series compensation current input module includes one state operation amplifying circuit U2A and the effective value conversion chip B; said U2A amplifies and adjusts the current signal of the series capacitor into voltage signal, said effective value conversion chip B converses the signal after amplifying and adjusting into $U_{CT}$.

In the fourth preferred embodiment of the present invention provided, said compare module includes two operation amplifier U3 and U3B, and two comparator U4 and U4B;

Said U3A makes difference between $U_{divide\ voltage}$ and $U_{CT}$;

Said U3B makes reverse on said $U_{divide\ voltage}$;

Said U4A compares the output of said $U_{divide\ voltage}$ with said U3B, and then outputs them;

Said U4B compares the output of said $U_{divide\ voltage}$ with said U3A, and then outputs them;

In the fifth preferred embodiment of the present invention provided, said U4A said U4B is the gate structure of the OC, the output ends connect each other;

When satisfying the condition $a \cdot U_{CT} \leq U_{divide\ voltage} \leq b \cdot U_{CT}$, said divider return circuit is running fine, the output end connecting to said U4A and said U4B outputs high level;

When satisfying the condition $U_{divide\ voltage} < a \cdot U_{CT}$ or $U_{divide\ voltage} > b \cdot U_{CT}$, said divider return circuit running is an exception, the output end connecting to said U4A and said U4B outputs low level warning.

Wherein, said a and b is the preset error coefficient, $a \leq b$.

In the sixth preferred embodiment of the present invention provided, the size of said error coefficient a and b can be achieved through adjusting the resistance value of said comparator U4A and U4B.

In the seventh preferred of embodiment the present invention it provides an online monitoring method of the series compensation spark gap divider return circuit, including any inline online monitoring circuit herein disclosed, said method includes:

Step S1, the voltage equalization link series capacitor C, gets the current signal of the series capacitor through serial-in a measurement CT in the current transformer secondary circuit;

Step S2, the amplified voltage of the two ends of the series capacitor C is converted into direct current signal $U_{divide\ voltage}$ by the sampling voltage input module, the amplified current signal of the series capacitor is converted into direct current signal $U_{CT}$ by the series compensation current input module.

Step S3, said compare module realizes online monitoring the running state of said series spark gap divider return circuit though comparing said $U_{divide\ voltage}$ with said $U_{CT}$.

In the eighth preferred embodiment of the present invention provided, said sampling voltage input module includes two state operating amplifying circuit U1B and U2B, and the effective value conversion chip A;

In step 2, the sampling voltage input module amplifies the voltage of the two ends of the series capacitor C, and converts it into direct current signal $U_{divide\ voltage}$, in particular to said U1B and U2B amplify and adjust the two ends of said capacitor C, said effective value conversion chip A converts said amplified and adjusted signal into $U_{divide\ voltage}$.

In the ninth preferred embodiment the present invention provided; said series compensation current input module includes one state operating amplifier circuit U2A and the effective value conversion chip B.

In step 2, the series compensation current input module amplifies the current signal of said series capacitor, and converts it into direct current voltage signal $U_{CT}$, in particular to said U2A amplifies and adjusts the current signal of the series capacitor into voltage signal, said effective value conversion chip B converses the amplified and adjusted signal into $U_{CT}$.

In the tenth preferred embodiment of the present invention provided, said compare module includes two operating amplifier U3A and U3B, and two comparator U4A and U4B;

In said step S3, said compare module realizes online monitoring the running state of said series spark gap divider return circuit though comparing said $U_{divide\ voltage}$ with said $U_{CT}$, including;

Step S301, said U3A makes difference between $U_{divide\ voltage}$ and $U_{CT}$, said U3B makes reverse on said $U_{divide\ voltage}$.

Step S302, said U4A compares the output of said $U_{divide\ voltage}$ and said U3B, and then outputs them; said U4B compares the output of said $U_{divide\ voltage}$ with said U3A, and then outputs them; the output ends of said U4A and U4B connect each other;

Step S303, When satisfying the condition $a \cdot U_{CT} \le U_{divide\ voltage} \le b \cdot U_{CT}$, said divider return circuit running fine, the output end connecting to said U4A and said U4B outputs high level;

When satisfying the condition $U_{divide\ voltage} < a \cdot U_{CT}$ or $U_{divide\ voltage} > b \cdot U_{CT}$, said divider return circuit running is an exception, the output end connecting to said U4A and said U4B outputs low level warning.

Wherein, said a and b is the preset error coefficient, a≤b.

In the eleventh preferred embodiment of the present invention provided, said U4A and said U4B is the gate structure of the OC, the size of said error coefficient a and b can be achieved through adjusting the resistance value of said comparator U4A and U4B.

To compare with existing technology, the online monitoring circuit and method of the series compensation spark gap divider return circuit this present invention provided have the following beneficial effects:

1. The online monitoring circuit and method of the series compensation spark gap divider return circuit this present invention provided, sets the voltage sampling link, propose an idea against the online monitoring circuit of the series compensation spark gap divider return circuit, it can be widely used in series compensation device, can let the operator master the working condition of the divider return, avoid unnecessary worry, make sure the spark gap can trigger ignition reliably when the line break down, improve the spark gap working reliability greatly;

2. Get the current signal of the series capacitor through serial-in a measurement CT in the current transformer secondary circuit, realized the measurement of the series capacitor current without adding any devices;

3. The comparator U4A and U4B is the gate structure of the OC (Open Collector), these two connected the outputs can realize the function of AND gate, simplified the circuit;

4. Setting the relation of $U_{divide\ voltage}$ and $U_{CT}$ is $a \cdot UCT \le U_{divide\ voltage} \le b \cdot UCT$, wherein a and b are presetting error coefficients, these two coefficients ensure that when any capacitor of the divider being damaged, the U divide voltage can not meet the status above, and the size of a and b can be realized by adjusting the resistance value of each comparator, which can be in a certain error range while meeting electricity $U_{divide\ voltage}$ and $U_{CT}$.

DETAILED DESCRIPTION OF EMBODIMENTS

The series compensation device includes the parallel series capacitor, the spark gap and the series spark gap divider return circuit. The present invention provides an online monitoring circuit of the series compensation spark gap divider return circuit, said divider return circuit sets the voltage equalization link and the voltage sampling link, wherein the voltage equalization link is the series capacitor C1, C2, C3 and C4, the voltage sampling link is the capacitor C, the capacitor C series the voltage equalization link, that is a series of C1, C2, C3 and C4.

Figure 1:
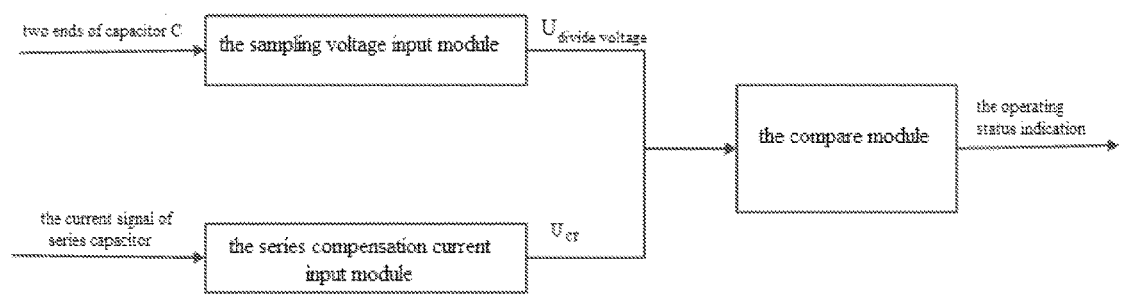
FIG. 1 is a structure diagram of an online monitoring circuit of the series compensation spark gap divider return circuit the present invention provided.

The specific structure diagram of the online monitoring circuit of the series compensation spark gap divider return circuit this present invention provided is as shown in FIG. 1. FIG. 1 shows, said monitoring circuit includes voltage sampling input module, series compensation current input module and the compare module, wherein the voltage of the voltage sampling input module is inputted from capacitor C two ends, and after amplifying it converses it into direct voltage signal $U_{divide\ voltage}$, and then outputs them, at the same time the current signal of the series compensation current input module is inputted from the series capacitor and it converses it into direct voltage signal $U_{CT}$ after amplifying it. The compare module through comparing the inputted $U_{divide\ voltage}$ with $U_{CT}$ achieves the online monitoring the running state of the divider return circuit.

Figure 2:
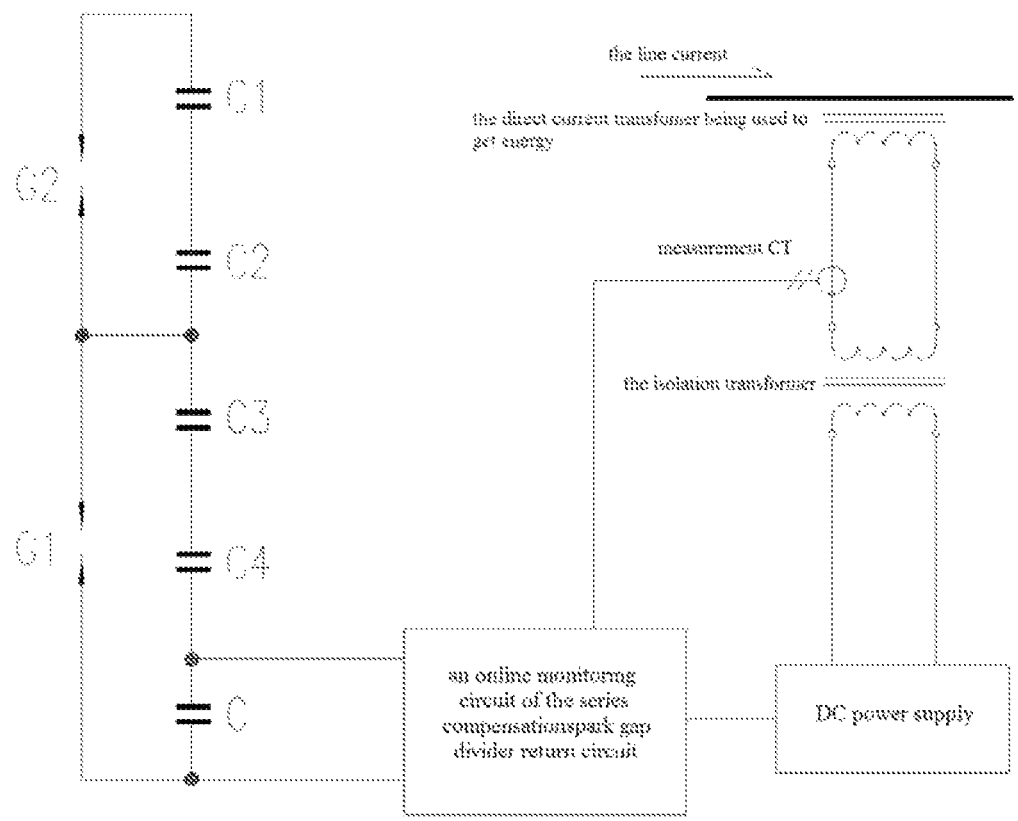
FIG. 2 is a working principle diagram of an online monitoring circuit of the series compensation spark gap divider return circuit the present invention provided.

FIG. 2 is a working principle diagram of the online monitoring circuit of the series compensation spark gap divider return circuit this present invention provided, as shown in FIG. 2, wherein that, the series compensation current input module of the online monitoring circuit gets the series capacitor current signal through serial-in a measurement CT in the current transformer secondary circuit being used to get energy.

Figure 3:
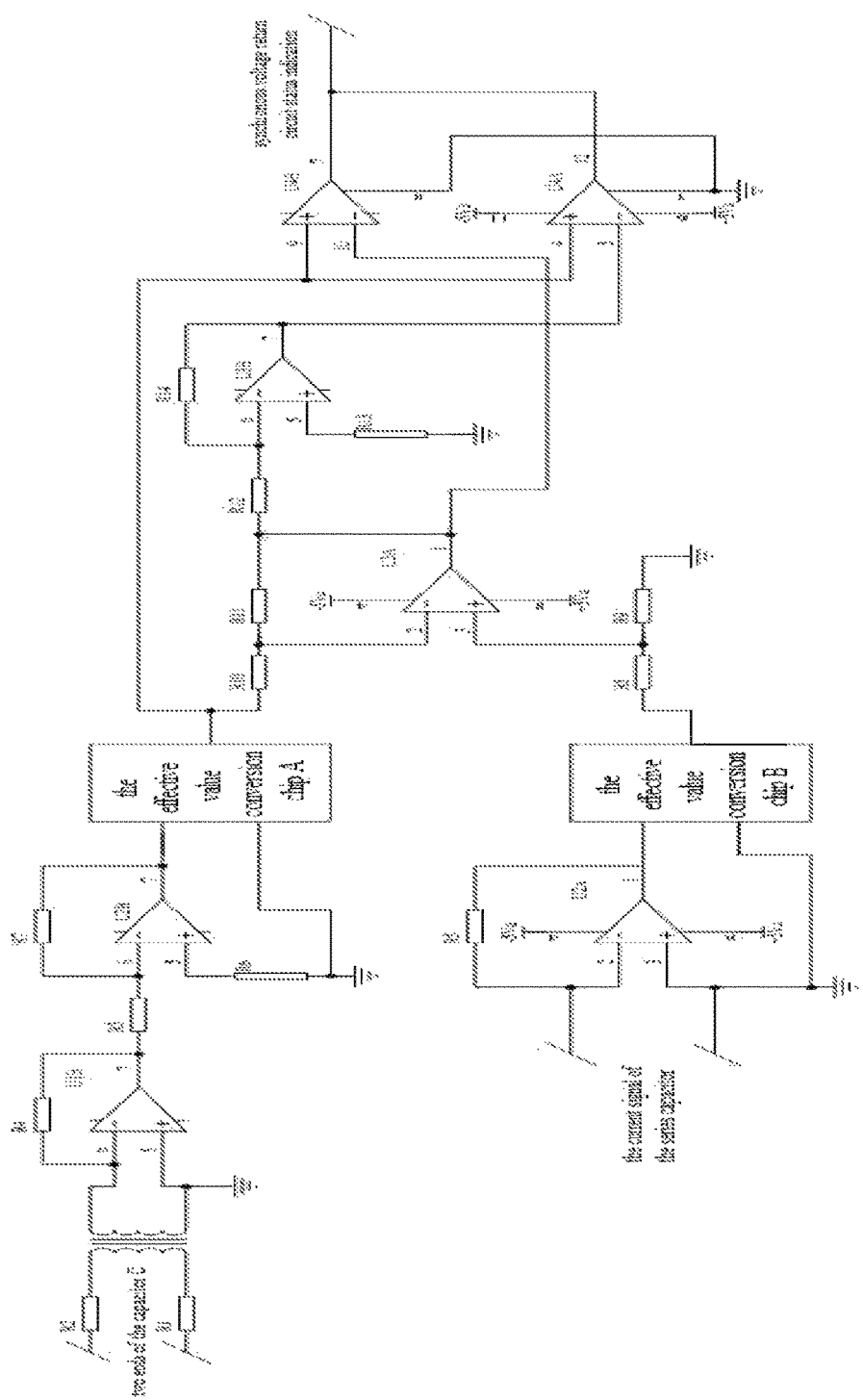
FIG. 3 is a circuit diagram of an online monitoring circuit of the series compensation spark gap divider return circuit the present invention provided.

FIG. 3 is a circuit diagram of the online monitoring circuit of the series compensation spark gap divider return circuit this present invention provided, as FIG. 3 shown, the voltage sampling input module includes the two state amplifying circuit U1B and U2B, and the effective value conversion chip A, wherein U1B and U2B amplify and adjust the two ends of said capacitor C, the effective value conversion chip A converses the signal after amplifying and adjusting into $U_{divide\ voltage}$ The series compensation current input module includes one state operation amplifying circuit U2A and the effective value conversion chip B; U2A amplifies and adjusts the current signal of the series capacitor into voltage signal, the effective value conversion chip B converses the signal after amplifying and adjusting into direct current voltage signal $U_{CT}$.

The compare module includes two operation amplifier U3A and U3B, and two comparator U4A and U4B;

U3A makes difference between direct current voltage signal $U_{divide\ voltage}$ and $U_{CT}$, U3B makes reverse on said direct current voltage sign $U_{divide\ voltage}$. U4A compares the output of said $U_{divide\ voltage}$ with said U3B, and then outputs them, at the same time U4B compares the output of said $U_{divide\ voltage}$ with said U3A, and then outputs them, the output end of U4A and U4B connect to each other, wherein, U4A and U4B is the gate structure of the OC, so that, U4A and U4B connected the outputs can realize the function of AND gate.

When satisfying the condition $a·U_{CT} \leq U_{divide\ voltage} \leq b·U_{CT}$, said divider return circuit running fine, the output end connecting to said U4A and said U4B outputs high level;

When satisfying the condition $U_{divide\ voltage} < a·U_{CT}$ or $U_{divide\ voltage} > b·U_{CT}$, said divider return circuit running is exception, the output end connecting to said U4A and said U4B outputs low level warning.

Wherein, said a and b is the preset error coefficient, $a \leq b$, and the size of said error coefficient a and b can be achieved through adjusting the resistance value of said comparator U4A and U4B.

Figure 4:
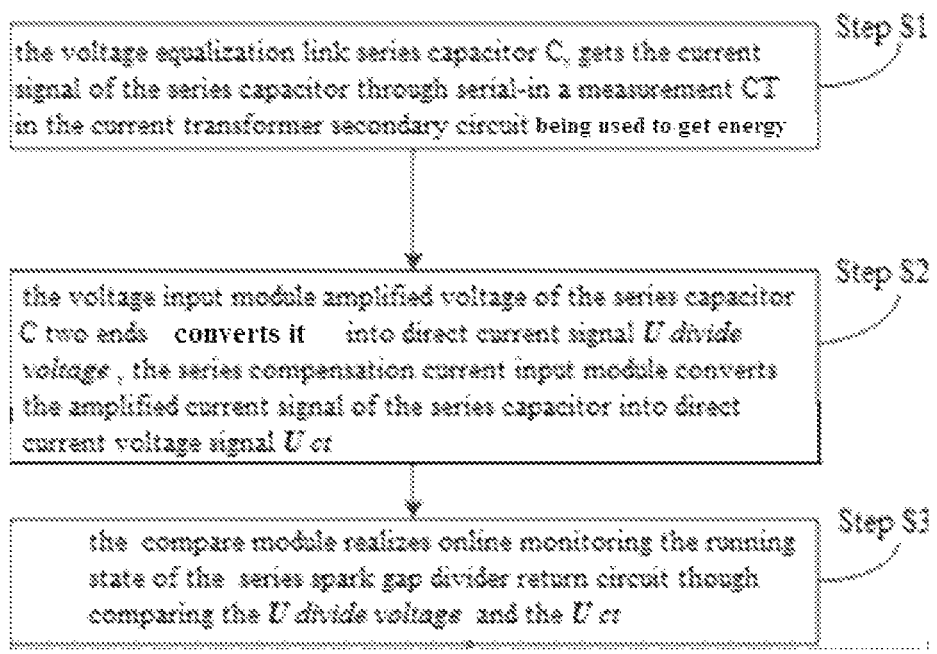
FIG. 4 is a method flow chart of an online monitoring circuit of the series compensation spark gap divider return circuit the present invention provided.

FIG. 4 is a method flow chart of an online monitoring circuit of the series compensation spark gap divider return circuit the present invention provided; as FIG. 4 shows, the method includes the following steps:

Step S1, the voltage equalization link series capacitor C, gets the current signal of the series capacitor through serial-in a measurement CT in the current transformer secondary circuit;

Step S2, the sampling voltage input module amplifies the voltage of the two ends of the series capacitor C and converts it into direct current signal $U_{divide\ voltage}$, the series compensation current input module amplifies the direct current signal of the series capacitor converts it into direct voltage signal $U_{CT}$.

Wherein, the voltage sampling input module includes the two state amplifying circuit U1B and U2B, and the effective value conversion chip A. The series compensation current input module includes one state operation amplifying circuit U2A and the effective value conversion chip B.

Specifically, the sampling voltage input module amplifies the voltage of the two ends of the series capacitor C, and converts into direct current voltage signal $U_{divide\ voltage}$ in particular to said U1B and U2B amplify and adjust the two ends of said capacitor C, said effective value conversion chip A converts said amplified and adjusted signal into $U_{divide\ voltage}$.

The series compensation current input module after amplifies the current signal of the series capacitor converts, and into it direct current voltage signal $U_{CT}$, in particular to U2A amplifies and adjusts the current signal of the series capacitor into voltage signal, the effective value conversion chip B converses the signal after amplifying and adjusting into $U_{CT}$.

Figure 5:
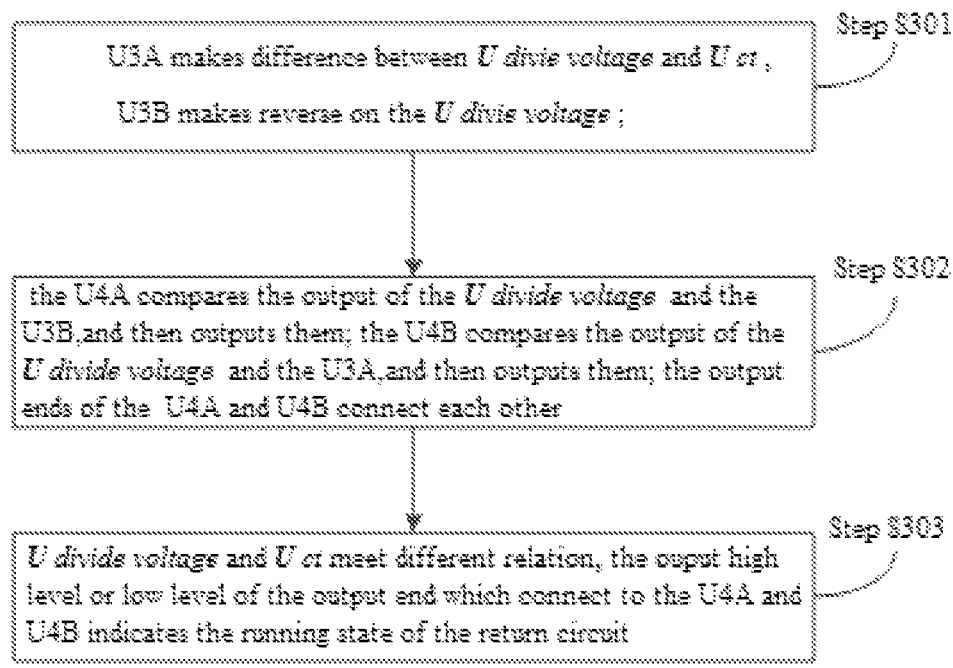
FIG. 5 is a method flow chart of realizing online monitoring circuit of the series compensation spark gap divider return circuit by the compare module the present invention provided.

Step S3, The compare module through comparing the inputted $U_{divide\ voltage}$ with $U_{CT}$ achieves the online monitoring the running state of the divider return circuit.

Where the compare module includes two operation amplifier U3A and U3B, and two comparator U4A and U4B;

Specifically, the method of the compare module through comparing the inputted $U_{divide\ voltage}$ and $U_{CT}$ achieves the online monitoring the running state of the divider return circuit is shown in FIG. 5, as FIG. 5 shows, the method includes the following steps:

Step S301, U3A makes difference between $U_{divide\ voltage}$ and $U_{CT}$, said U3B makes reverse on said $U_{divide\ voltage}$.

Step S302, U4A compares the output of $U_{divide\ voltage}$ with U3B, and outputs them, U4B compares the output of $U_{divide\ voltage}$ with U3A, and then outputs them, the output end of U4A and U4B connect to each other;

Step S303, when satisfying the condition $a·U_{CT} \leq U_{divide\ voltage} \leq b·U_{CT}$, said divider return circuit running fine, the output end connecting to said U4A and said U4B outputs high level; When satisfying the condition $U_{divide\ voltage} < a·U_{CT}$ or $U_{divide\ voltage} > b·U_{CT}$, said divider return circuit running is exception, the output end connecting to said U4A and said U4B outputs low level warning.

Wherein, said a and b is the preset error coefficient, $a \leq b$, and the size of said error coefficient a and b can be achieved through adjusting the resistance value of said comparator U4A and U4B.

U4A and U4B is the gate structure of the OC, so that, U4A and U4B connected the outputs can realize the function of AND gate.

At last, in this description of the embodiment, we have detail describe the present invention according to a particular example. The detail embodiment is one example of the invention but not the only one, so the person in this field must be understand that all the alternatives and other equal and/or similar examples are all within the range of the invention and they are all consistent with the spirits of this invention, are all protected by our claims.

What is claimed is:

1. An online monitoring circuit of the series compensation spark gap divider return circuit, is characterized that, said series compensation spark gap divider return circuit includes a voltage equalization link and a voltage sampling link; said voltage sampling link includes a capacitor C;

said online monitoring circuit includes a voltage sampling input module, a series compensation current input module and a compare module;

said sampling voltage input module amplifies the voltage of the two ends of the series capacitor C, and converts it into direct current signal $U_{divide\ voltage}$;

said series compensation current input module amplifies the current signal of said series capacitor, and converts it into direct current voltage signal $U_{CT}$; and said compare module performs online monitoring of the running state of said series spark gap divider return circuit by comparing said $U_{divide\ voltage}$ with said $U_{CT}$;

wherein said compare module includes two operating amplifier U3A and U3B, and two comparator U4A and U4B;

said U3A makes difference between $U_{divide\ voltage}$ and $U_{CT}$;

said U4A compares the output of said U3B with said $U_{divide\ voltage}$, and output the comparison data; and said U4B compares the output of said U3A with said $U_{divide\ voltage}$, and output the comparison data.

2. The online monitoring circuit according to claim 1, wherein said series compensation current input module of the online monitoring circuit obtains the series capacitor current signal through a current transformer secondary circuit.

3. The online monitoring circuit according to claim 1, wherein said voltage equalization link includes series capacitor C1,C2,C3 and C4; said sampling voltage input module includes the two state amplifying circuit U1B and U2B, and the effective value conversion chip A;

wherein said U1B and U2B amplify and adjust the two ends of said capacitor C, said effective value conversion chip A converts said amplified and adjusted signal into $U_{divide\ voltage}$.

4. The online monitoring circuit according to claim 1, wherein said series compensation current input module includes one state operating amplifier circuit U2A and the effective value conversion chip B; said U2A amplifies and adjusts the current signal of the series capacitor into voltage signal, said effective value chip B converses the amplified and adjusted signal into $U_{CT}$.

5. The online monitoring circuit according to claim 1, wherein said U4A and said U4B comprise the gate structure of an OC, the output ends connect each other;

when it is satisfying the condition $a \cdot U_{CT} \leq U_{divide\ voltage} \leq b \cdot U_{CT}$, said divider return circuit running fine, the output end connecting to said U4A and said U4B outputs high level;

when it is satisfying the condition $U_{divide\ voltage} < a \cdot U_{CT}$ or $U_{divide\ voltage} > b \cdot U_{CT}$, the output end connecting to said U4A and said U4B outputs a low level warning, and wherein, said a and b is the preset error coefficient, a≤b.

6. The online monitoring circuit according to claim 5, wherein the size of said error coefficients a and b can be achieved through adjusting the resistance value of said comparator U4A and U4B.

7. The online monitoring method of the series compensation spark gap divider return circuit, including any online monitoring circuit according to claim 6, wherein said method includes:

step S1, the voltage equalization link series capacitor C obtains the current signal of the series capacitor using a serial current transformer;

step S2, said sampling voltage input module amplifies the voltage of the two ends of the series capacitor C, and converts it into direct current signal $U_{divide\ voltage}$, said series compensation current input module amplifies the current signal of said series capacitor, and converts it into direct current voltage signal $U_{CT}$; and step S3, said compare module performs online monitoring of the running state of said series spark gap divider return circuit by comparing said $U_{divide\ voltage}$ with said $U_{CT}$.

8. The online monitoring circuit according to claim 7, wherein said sampling voltage input module includes two state amplifying circuit U1B and U2B, and the effective value conversion chip A;

in step 2, the sampling voltage input module amplifies the voltage of the two ends of said capacitor C, and converts it into direct current signal $U_{divide\ voltage}$, in particular to said U1B and U2B amplify and adjust the two ends of said capacitor C, said effective value conversion chip A converts said amplified and adjusted signal into $U_{divide\ voltage}$.

9. The online monitoring circuit according to claim 7, wherein said series compensation current input module includes one state operating amplifier circuit U2A and an effective value conversion chip B;

in step 2, the series compensation current input module amplifies the current signal of said series capacitor, and converts it into direct current voltage signal $U_{CT}$, in particular to said U2A amplifies and adjusts the current signal of the series capacitor into voltage signal, said effective value conversion chip B converses the amplified and adjusted signal into $U_{CT}$.

10. The online monitoring circuit according to claim 7, wherein said compare module includes two operating amplifier U3A and U3B, and two comparator U4A and U4B;

in said step S3, said compare module realizes online monitoring the running state of said series spark gap divider return circuit though comparing said $U_{divide\ voltage}$ with said $U_{CT}$, including;

step S301, said U3A makes difference between $U_{divide\ voltage}$ and $U_{CT}$, said U3B makes reverse on said $U_{divide\ voltage}$;

step S302, said U4A compares the output of said $U_{divide\ voltage}$ with said U3B, and then outputs them; said U4B compares the output of said $U_{divide\ voltage}$ with said U3A, and then outputs them; the output ends of said U4A and U4B connect each other;

step S303, When it is satisfying the condition $a \cdot U_{CT} \leq U_{divide\ voltage} \leq b \cdot U_{CT}$, said divider return circuit running is fine, the output end connecting to said U4A and said U4B outputs high level;

when satisfying the condition $U_{divide\ voltage} < a \cdot U_{CT}$ or $U_{divide\ voltage} > b \cdot U_{CT}$, said divider return circuit running is exception, the output end connecting to said U4A and said U4B outputs low level warning;

wherein, said a and b is the preset error coefficient, a≤b.

11. The online monitoring circuit according to claim 7, wherein said U4A and said U4B comprise the gate structure of the OC, the size of said error coefficients a and b can be achieved through adjusting the resistance value of said comparator U4A and U4B.

* * * * *